United States Patent [19]

Merry

[11] 4,192,640

[45] Mar. 11, 1980

[54] MULTIPLE TRANSFER PROCESS AND ARTICLE RESULTING THEREFROM

[75] Inventor: Glenn W. Merry, Lincoln, Mass.

[73] Assignee: Winter Park Associates, Winnetka, Ill.

[21] Appl. No.: 825,445

[22] Filed: Aug. 17, 1977

Related U.S. Application Data

[63] Continuation of Ser. No. 602,295, Aug. 6, 1975, abandoned.

[51] Int. Cl.$^2$ .......................... G03C 5/54; G03C 5/00
[52] U.S. Cl. ..................................... 430/248; 430/16; 430/244; 430/311
[58] Field of Search ............................... 96/29 R, 38.4

[56] References Cited

U.S. PATENT DOCUMENTS

| | | | |
|---|---|---|---|
| 2,977,226 | 3/1961 | Land | 96/29 R |
| 3,033,765 | 5/1962 | King et al. | 96/29 R |
| 3,433,634 | 3/1969 | De Haas | 96/29 R |
| 3,464,822 | 9/1969 | Blake | 96/29 R |
| 3,486,893 | 12/1969 | Strange | 96/38.4 |
| 3,551,149 | 12/1970 | Nawn et al. | 96/38.4 |
| 3,822,127 | 7/1974 | Tsuboi et al. | 96/29 R |
| 3,932,187 | 1/1976 | Batter | 96/78 |

Primary Examiner—Richard L. Schilling
Attorney, Agent, or Firm—Richard J. Birch

[57] ABSTRACT

A photographic process and article resulting therefrom which utilizes multiple images that are transferred to a single image receiving surface. In the preferred embodiment the images are formed on the receiving surface by diffusion transfer development and each image on the receiving surface is electrically conductive. In the areas in which the images overlap, the electrical resistivity is lower than in the nonoverlapped areas. Electrical resistivity in a given area can be controlled by the number of images transferred to the receiving surface. One application of the process is the formation of electrical components such as, printed circuit boards, by photographic diffusion transfer development.

27 Claims, 11 Drawing Figures

MULTIPLE TRANSFER PROCESS AND ARTICLE RESULTING THEREFROM

This is a continuation of application Ser. No. 602,295 filed Aug. 6, 1975, now abandoned.

BACKGROUND OF THE INVENTION

The present invention relates to photographic processes in general and, more particularly, to a photographic process in which multiple images are transferred to a single image receiving surface.

The use of diffusion transfer development processes is well known in the photographic art. Perhaps the most obvious example of the use of a DTR process is in the field of "instant" photography. "Instant" photography was developed and commercially exploited by the Polaroid Corporation of Cambridge, Massachusetts. The general photographic process employed in "instant" photography was described by Polaroid Corporation's founder, Dr. Edwin H. Land; in an article entitled "A New One-Step Photograhic Process" published in the *Journal of the Optical Society of America*, Vol. 37, No. 2, February 1947, at Pages 61–77. The United States patent literature is replete with Polaroid Corporation's patents which describe and claim various processes, equipments and materials for "instant" photography. Representative examples include the following U.S. Pat. Nos. 2,500,421; 2,543,181 and 3,345,161, (processes); 2,774,667 and 3,345,166 (negative materials); 2,698,237; 2,698,245; 2,774,667 and 3,345,166 (processing chemicals); 2,698,237; 2,698,238, 2,698,245; 2,774,667 and 2,823,122 (receiver sheets).

In recent years considerable interest has been shown in the idea of using photographic processes to produce electrically conductive patterns and components in which the photosensitive material itself forms a part of the pattern or component. This is in contrast to the conventional photoresist techniques for producing copper-clad printed circuit boards in which the current carrying copper itself is not photosensitive.

Various proposals have been suggested to use the exposed silver in a photographically developed negative as a current carrying element. See of example U.S. Pat. Nos. 3,647,456 (IBM) and 3,551,149 (Polaroid). The amount of silver in the exposed and developed areas of the negatives was considered insufficient to achieve the required conductivity for circuit applications such as, printed circuit boards. A number of processes to increase the conductivity of the photographically formed silver patterns have been described in the patent literature, e.g. intensification of the exposed areas, U.S. Pat. Nos 3,615,483 (U.S. Phillips) and 3,822,128 (Horizons, Inc.); diffusion transfer reversal 3,464,822 (DuPont); and D.T.R. with intensification 3,822,127 (Fugi) and 3,033,765 (Kodak).

The photographic processes described in the above-listed patents were relatively complicated and achieved generally marginal results in terms of the requisite electrical conductivity of the photographically produced silver pattern.

It is accordingly a general object of the present invention to provide a photographic process and article in which multiple images of unexposed and developed photosensitive material are formed on a single receiving surface.

It is a specific object of the invention to provide a photographic process for producing electrically conductive patterns and components in which the photosensitive materials, itself, forms part of te patterns and components.

It is still another object of the invention to photographically produce electrically conductive patterns and components using a diffusion transfer development process.

It is a feature of the invention and that the novel process thereof can be carried out with conventional apparatus, photosensitive materials and processing chemistry.

It is another feature of the invention that the novel photographic process can be varied to obtain predetermined electrical resistivities in the photographically formed electrical patterns and components.

BRIEF DESCRIPTION OF THE INVENTION

A photographic process in which a first latent image segment having at least one unexposed area is formed in a photosensitive material. The first latent image is photographically developed and then the unexposed, developed photosensitive material thereof is transferred to a receiving surface. A second latent image segment having at least one unexposed area is formed on a photosensitive material and then developed photographically. The unexposed, photosensitive material from the developed second latent image is transferred to the receiving surface. In the preferred embodiment, the transferred, unexposed photosensitive materials from the first and second developed latent images are rendered electrically conductive on the receiving sheet.

If portions of the unexposed photosensitive materials from the first and second developed latent images overlap each other on the receiving surface, the resulting electrical resistivity of the overlapped portions is less than the electrical resistivity of the non-overlapped portions. The electrical resistivity of the overlapped portions can be decreased further by transferring thereon additional developed, unexposed photosensitive material from a third latent image. The process can be repeated until the desired electrical resistivity (or conductivity) is obtained.

DETAILED DESCRIPTION OF THE INVENTION

The objects and features of the invention will best be understood from a detailed description of the preferred embodiment thereof selected for purposes of illustration and shown in the accompanying drawings, in which.

Figure 1:
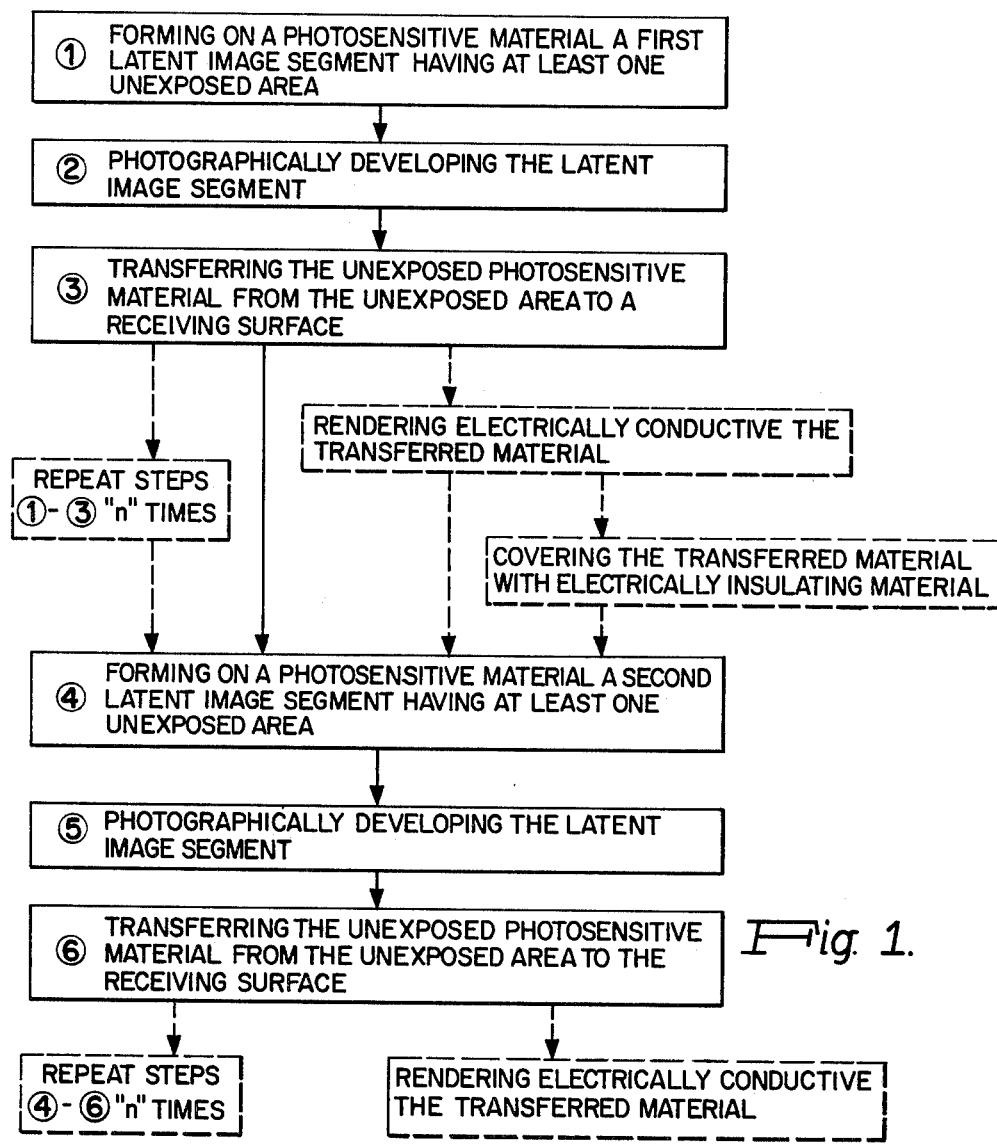
FIG. 1 is a flow diagram showing the steps of the process with optical steps indicated by dashed lines.
Figure 2:
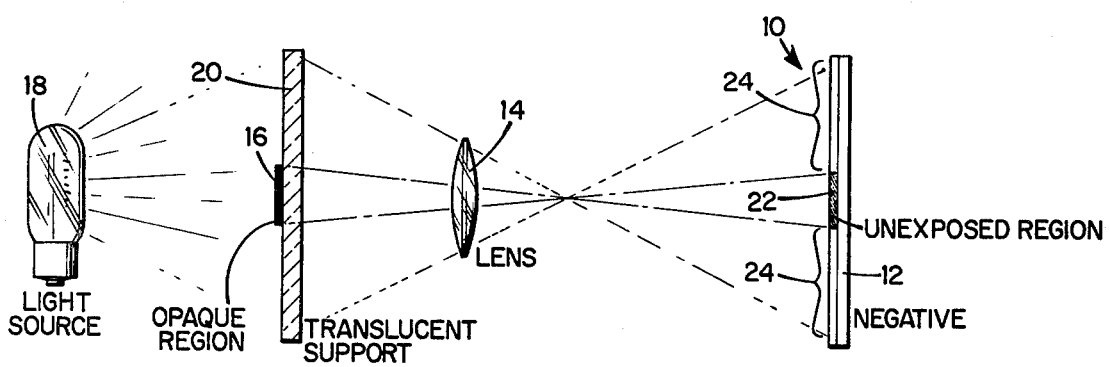
FIG. 2 is a diagrammatic view showing the photoexposure of a photosensitive material having at least one unexposed image segment.
Figure 3:
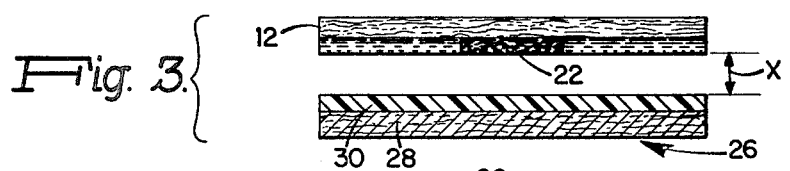
FIGS. 3 through 6 illustrate diagrammatically the the diffusion transfer development of the FIG. 2 exposed photosensitive materials with FIG. 6 depicting the resulting metallic silver layer on a receiving surface.

Turning now to the drawings, there is illustrated in flow form in FIG. 1 the process of the invention in which multiple images of unexposed and developed photosensitive material are formed on a single receiving surface or sheet. FIGS. 2-10 illustrate in diagrammatic form one embodiment of the process. FIG. 2 depicts one method for forming a latent image, indicated generally by the reference numerial 10, on a photosensitive material or "negative" 12. The latent image 10 can be formed by conventional optical means such as, by contact or projection printing. The later method is illustrated in FIG. 2 in which an optical system, indicated diagrammatically by a single double convex lens 14, images an object 16 the photosensitive material 12. Preferably, the object 16 is opaque and is back-lighted by a light source 18 against a translucent background 20 in order to improve the contrast between the object 16 and the background 20. It will be appreciated that other lighting arrangements can be employed depending upon the particular object.

In the case of printed circuit boards, the "object" comprises the art work depicting the circuit board patterns with the circuit patterns being opaque for a back-lighted situation or "black" for a front-lighted arrangement. The term "Black", as used herein, means black in the conventional sense as well as any other color which will produce an unexposed area on a photosensitive material, e.g. by a suitable choice of the spectral sensitivity of the film or by filtration. The point to be noted here is that the latent image 10 (which may be a segment of a larger latent image) has at least one unexposed area 22. The unexposed area 22 may comprise all or only a portion of the latent image or latent image segment 10. In most applications, the latent image 10 will also have one or more exposed areas 24. However, for purposes of understanding the invention, it is sufficient to examine only one unexposed area in the image.

A variety of different commercially available films can be used as the photosensitive material or "negative" 12. It is desirable to use films with a high silver content as the negative material. I have found that among the black and white films sold by the Polaroid Corporation, Type 51 (high contrast) yields the best transfer of the complex silver compound in a diffusion transfer process. Eastman Kodak Company's film sold under the trade designation "No Screen" medical x-ray film also produces desirable results in terms of the silver transfer.

Looking at FIGS. 3 through 6, there is depicted in diagrammatic form the sequential steps of a conventional diffusion transfer process using the exposed photosensitive material 12 of FIG. 2. The exposed negative 12 is positioned adjacent to and separated from a receiving surface or sheet 26 by a predetermined distance, indicated as dimension "x" in FIG. 3. The receiving surface or sheet 26 comprises a base material 28 having coated thereon a nucleating agent 30. Suitable diffusion transfer receiver sheets are well known in the art. Representative examples in the patent literature are described in U.S. Pat. Nos. 2,698,237; 2,698,238; 2,698,245; 2,774,667; and, 2,823,122.

Figure 4:
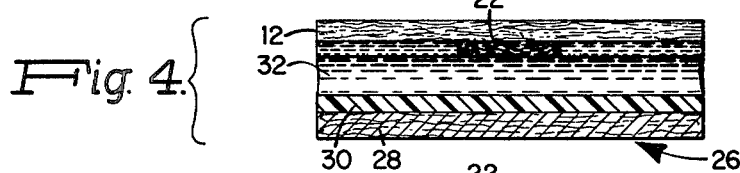
Figure 5:
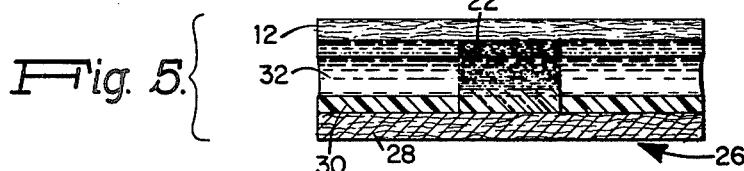

The distance of gap "x" between the exposed negative 12 and the receiving surface 26 is filled with a reagent 32 as shown in FIG. 4. The reagent comprises a developing agent to develop the exposed areas, if any, of the photosensitive material and a reducing agent to convert ionic silver in the unexposed areas 22 to metallic silver. Various known processing chemistries can be employed to achieve the foregoing reactions. See for example, the photo processing liquids described in U.S. Pat. Nos. 2,500,421, 2,543,181 and 3,345,161. The distance "x" is determined by the selected processing chemistry and typically is in the range of 0.0018-0.0054". U.S. Pat. No. 2,759,825 describes a range of 0.002-0.003". This distance or "gap" can be readily achieved by using the thickness of a border "mask" to separate the exposed negative and receiver sheet, e.g. U.S. Pat. No. 2,759,825.

Figure 6:
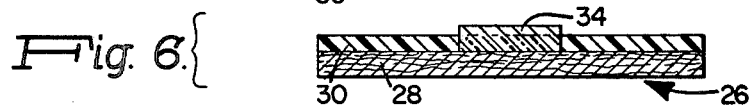

The metallic silver produced by the reduction of the unexposed areas 22 is nucleated by the nucleating agent 30 on the reciever sheet 26 as diagrammatically illustrated in FIG. 6 by silver layer 34. After formation of the silver layer 34 on the receiver sheet, the negative 12 and reagent layer 32 are stripped away from the receiver sheet. It is now possible to remove any residual necleating agent which was not used in the process of depositing the first layer of metallic silver 34.

Up to this point, the process is the same at the conventional diffusion transfer development process employed in the graphic arts field and by the Polaroid Corporation in its "instant" photography applications. The results which I have obtained with respect to the electrical resistivity of the first metallic silver layer by using different types of Polaroid Corporation films and Eastman Kodak films with different processing chemistries and under a variety of processing parameters will be discussed below. It is sufficient for the moment to observe that the receiver sheet 26 contains a layer of metallic silver corresponding to the unexposed area or areas of the latent image 10, that this layer has a given electrical resistivity and that the layer has some thickness. For purposes of illustration, the vertical scale of all of the layers in the drawings has been exaggerated.

Figure 7:
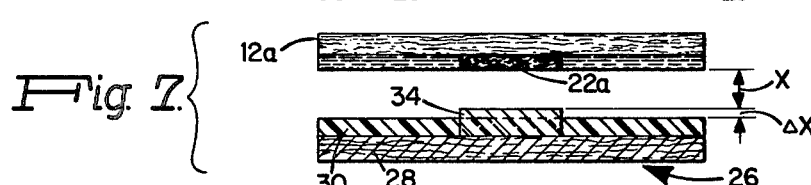
FIGS. 7 through 10 illustrate diagrammatically the diffusion transfer development of another exposed photosensitive material with FIG. 10 showing the resulting second layer of metallic silver on the receiving surface in superposed registration with the layer previously formed by the steps illustrated in FIGS. 3 through 6.

Looking now at FIG. 7, a new negative 12a is positioned adjacent to and spaced from the receiver sheet 26 which contains the metallic silver layer 34. The spacing between the negative and the receiver preferably is adjusted to compensate for the thickness of the metallic silver layer 34. Thus the spacing is $x + \Delta x$ where $\Delta x$ equals the thickness of the first silver layer 34 (or insulating layer shelves of the silver layer and of the optical layer of an electrically insulating material).

The new negative 12a is exposed in the same manner as the FIG. 2 negative 12 with at least one unexposed area 22a. The unexposed area 22a may or may not have the same geometric configuration and size as the unexposed area 22 on the first latent image depending upon the desired end result. For purposes of explanation, let us assume that the unexposed area 22a in the second latent image segment or negative 12a has the same geometric configuration and size as the unexposed area 22 in the first latent image of negative 12.

Figure 8:
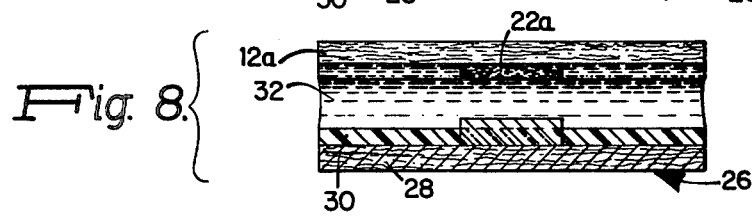
Figure 9:
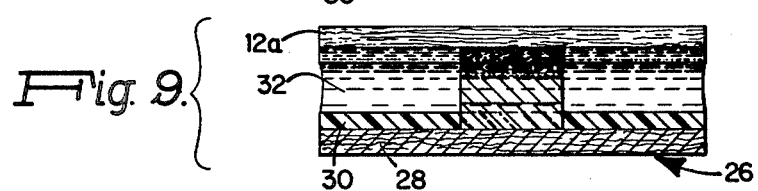
Figure 10:
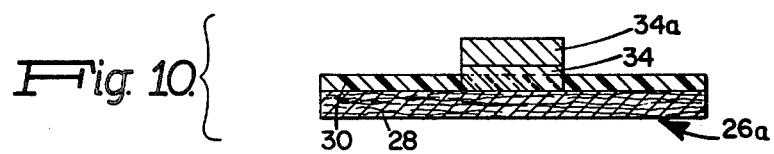

If the second negative 12a is positioned with respect to the receiver sheet 26 and silver layer 34 thereon so that the unexposed area 22a is in superposed registration with the silver layer, the second negative 12a can be processed in the same manner as the first negative i.e., as shown in FIGS. 8 and 9. Looking at FIG. 8, new reagent is introduced into the gap between the negative 12a and the receiver sheet 26. The reaction takes place as shown in FIG. 9, with the difference that now the metallic silver 34 from the previous processing functions as the nucleating agent for silver from the unexposed area 22a and second negative. The resulting receiver sheet 26a is depicted in FIG. 10 with the nucleated metallic silver from the unexposed area of second developed latent image segment deposited as a layer 34a in superposed registration with the metallic silver layer 34 from the unexposed areas of the first latent image segment.

The process described above for the second negative 12a can be repeated with a "third" newly exposed negative and so on to the "$n^{th}$" negative to produce n layers of metallic silver on the same receiver sheet. If portions of the layers overlie (i.e. overlap) each other, the electrical resistivity in the overlapped areas decrease with each successive deposition, of a metallic silver layer from a new negative.

It will be appreciated from the foregoing, that by controlling the number of layers of metallic silver in a given area of the receiver sheet, one can produce predetermined different electrical resistivities on the receiver sheet. In addition to forming electrically conductive patterns or conductors such as, for a printed circuit board, it is also possible to photographically produce "resistors" in the circuit. If a "layer" of an electrically insulative material is positioned between two layers of metallic silver, a capacitor can be formed on the receiver sheet. Capacitive and inductive effects also can be achieved by forming adjacent, but electrically separated patterns of metallic silver on the receiver sheet.

The insulating layer preferably should comprise a dielectric material that is compatable with both the silver layer and the nucleating and precipatating material employed in the art. For example polyvinyl alcohol, hydroxethyl cellulose, sodium carboxmethyl cellulose, and regenerated cellulose are satisfactory. The "layer" can be formed by a variety of known techniques such as, by a discrete sheet that is laminated or bonded to the previous image(s) on the receiver sheet, or by coating or preciptating the material on the reciever sheet image(s).

The resulting insulating layer can then be nucleated to permit the subsequent formation of another silver layer thereon. The insulating layer can cover all or only a portion of the previously transferred unexposed photosensitive material and can be masked to allow electrical interconnections between the silver layer on the receiver sheet. Such masking can be accomplished in many ways including a discrete mask or one which is photographically laid down on the silver layer in the manner of the organic components in color DTR.

Various perimetations of this sequence can be employed to produce different electrical characteristics on the receiver sheet. For example, as shown in FIG. 1, the first three steps can be repeated "n" times, (where "n" is a positive whole number including (1) before covering at least a portion of the transferred unexposed photosensitive material on the reciever sheet, with an electrically insulating material. A similar option is available with respect to the number of transfers after the insulating material covering operation.

The process of the invention can be generalized by the following formula for the deposition sequence:

$$S_t = \sum_{1}^{N} \cdot S_n(T)$$

where T equals the efficiency of the transfer process, and $S_n$ equals the silver content of the negative, and N equals the number of transfers performed, so that $S_t$ equals the total amount of metallic silver deposited in a sequence.

As shown below in Table 1, the number of transfers required varies according to the silver content in each of the commercially available negatives.

TABLE 1

| Negative Type | MgAg/in.$^2$ | Percent of Required Ag (2) | Required Deposition (3)(4) |
|---|---|---|---|
| Polaroid 57 | .55 | 2 | 50 |
| Polaroid 55 | .80 | 3 | 34 |
| Polaroid 52 | .80 | 3 | 34 |
| Polaroid 51 | 2.38 | 9 | 12 |
| Kodak RP-14 | 2.73 (1) | 10 | 10 |
| Kodak 6556 | 2.93 | 11 | 10 |
| Kodak 4147 | 3.20 | 12 | 9 |
| Kodak 4141 | 3.20 | 12 | 9 |
| Kodak 4164 | 3.28 | 12 | 9 |
| Kodak 4154 | 3.88 | 14 | 8 |
| Kodak 4155 | 4.33 | 16 | 7 |
| Kodak M54 | 5.40 (1) | 20 | 5 |

Notes:
(1) per side, for double-coated materials
(2) i.e. to form a conducting silver layer equivalent to a one-eighth ounce traditional copper-clad printed circuit laminate material. 100% transfer from negative assumed.
(3) i.e. the number of deposition cycles to reach 100% of the required weight of silver. In the case of fractional depositions the required number has been rounded up to provide the necessary silver.
(4) 100% transfer of silver from negative assumed.
For transfer levels of less than 100% the figures in the right hand column are increased proportionally.

In the examples shown in Table 1, the theoretical level of silver required is calculated by taking the standard given in the *IPC Technical Manual*, published by the Institute of Printed Circuits, 1717 Howard Street, Evanston, Ill. 60202, as standard number 2.2.12 entitled "Thickness of Copper by Weight", dated April 1973, which states that a one ounce copper foil layer with a nominal thickness of 0.0014 inches should weigh 50 grams plus or minus 5 grams per 254 square inches (0.164 square meters), or 304.9 grams of copper per square meter, and thus 30.5 milligrams of copper per centimeter squared. Given the fact that silver, with a density of 10.5 grams per centimeter cubed, is 18% heavier than copper, at 8.9 grams per centimeter cubed, it is necessary to increase the equivalent weight of silver to 36.0 mgs. per centimeter squared, but because silver is 5% more conductive than copper, this value may be reduced to 34.2 mgs. per centimeter squared. Thus, the weight of silver required to provide for electrical performance similar to a conducting layer comprised of copper becomes 34.2 mgs. per centimeter squared for a one ounce LPC rating, 17.1 for a half-ounce rating, 8.6 for a quarter-ounce rating, and 4.3 for a one eighth-ounce rating. As noted in Table 1, the one eighth-ounce rating is used for illustrative purposes therein.

As also noted in Table 1, it is assumed for illustrative purposes that 100% of the silver present in the negative material is transferred to the receiving surface. As shown below in Table 2, various materials, i.e. various combinations of negatives, processing solutions and receiving materials, result in the transfer of various percentages of the silver present in the negative to the receiving sheet. In each

TABLE 2

| Polaroid Film Type | Negative MgAg/in$^2$ | Receiving MgAg/in$^2$ | Percent Ag Transferred |
|---|---|---|---|
| 51 | 2.38 | .58 | 24 |
| 57 | .55 | from .15 to .23 | 35 |
| 52 | .80 | .40 | 50 |
| 55 | .80 | .63 | 79 | case in Table 2 the data represents that obtained by processing unexposed negatives with the processing fluid and receiver sheet supplied with each film type. Information concerning the processing fluids and receiver sheets for each film type can be obtained from the United States Patents listed on the foil wrapping (pre-June 1973). In each case in Table 2 the processing time was 180 seconds at 70° F.

Other experimental work has shown that other receiving sheet materials, namely Eastman Kodak type PMT Receiver paper and Agfa-Gevaert Copyproof PPG Positive paper are capable of forming silver images, though of generally less desirable characteristics, i.e. the amount of silver transferred to these materials is only a few percent of that available for transfer from the negative material. Of the two Agfa PPG is the better.

It will be appreciated that a high silver content in the negative material and a high percentage of transfer of this silver to the receiver sheet is desirable. For example, if the Negative material supplied with Polaroid type 51 film (High Contrast) is used in conjunction with the processing solution of Polaroid type 55 film (Positive/-Negative) 78% of the silver present in the type 51 negative can be transferred to the receiver. A slight improvement in transfer is achieved by the use of the type 51 receiving sheet material in this case. Additionally, it is possible to increase the percentage of silver transferred up to between 90 and 95% by increasing the gap between negative and receiver. A suitable increase in the gap may be, for example, twice that provided for in the materials as commercially sold, or from 0.002 to 0.003 to 0.004 to 0.006. In this respect, it will be appreciated that further increases in the gap will gradually decrease the effective percentage transfer.

Elevated temperatures during processing can be employed for two useful purposes. First, elevated temperatures of up to 150° F. may be employed to shorten the processing time from 3 minutes or more, to less than 3 minutes. Secondly, materials processed at higher temperatures often exhibit a higher percentage transfer of silver from the negative.

In the case of multiple transfer to a receiver all of the above may be employed to improve the transfer of silver and yield transfers of 95% with regularity. Prior to making a second, or subsequent, transfer to a receiver it is often desirable to allow the previously formed silver image to stabilize. In this respect it is useful to carry out the processing and stripping away of the receiver from the negative in an inert atmosphere free from water vapor, e.g. a dry nitrogen atmosphere. It is additionally useful in such an environment to raise the ambient temperature to up to 150° F. to speed up and assist in the formation of a dry, stable silver image layer on the receiver.

With certain negative materials e.g. those with large silver Halide grains (> about 1 to $2\mu$) and/or thick emulsions (e.g. x-ray and graphic arts material) it is desirable to perform the processing in two steps, i.e. first the negative material is developed, either in a bath or by sandwiching it with a superposed layer between which a developer fluid is introduced. Subsequent to the full development of any exposed emulsion it is possible to reprocess the developed negative material with a DTR type processing fluid which normally includes a highly alkaline deaerated thiosulfate solution. This sequence has the desirable effect of allowing one to use a more efficient developer, with respect to transfer while employing a developer suited to efficient image formation in the negative. Thus the distinction is clearly made between developers suited to image formation in an efficient manner and those best suited to play role in the reduction of soluble silver complexes to metallic silver subsequent to the diffusion of the unexposed areas to the site at which the nucleating agent initiates reduction of the transferred silver.

In a preferred form the negative material which has been exposed to the pattern to be formed is developed to reduce exposed silver halide grains to metallic clusters, washed in a water bath, dried, and then placed in a superposed position with respect to a receiving sheet. A DTR type processing fluid is then introduced between the processed negative and the receiver to transfer and reduce unexposed silver halide to the receiver. After processing the receiver is dried and prepared to accept a subsequent transfer carried out by similar means. In this way a sequence of silver layers is built up which both utilize the available silver in the most economical way and preserve the pattern.

It will be appreciated that for certain commercial application of the multiple deposition technique of forming thin film metallic layers a reasonable level of conductivity in the metallic layer is required.

One standard of reference for the conductivity of metallic layers is standard number 2.5.13 entitled "Resistance of Copper Foil" dated April 1973 and published by the Institute of Printed Circuits, 1717 Howard Street, Evanston, Ill. 60202 in the *IPC Technical Manual*. In this standard, copper foil is evaluated by use of the following formula:

$$R_{20} = ((R_t)(W)/(1+OC_{20})(t-20)(L)$$

Where:
$R_t$ = the measured resistance in ohms of the sample at $t°$ C.
$t$ = the temperature of the sample in ° C.
$W$ = the width of the sample in inches
$L$ = the length of the sample in inches
$OC_{20} = 0.00378"$ for a one ounce rated copper clad laminate.
$OC_{20} = 0.00368"$ for a half-ounce rated copper clad laminate.

The recommended limit for copper foil in ohms-gram/meter$^2$ at 20° C. is 0.16359 for one half-ounce material, and 0.15940 for one ounce material.

If we compare the results obtained with the DTR process utilized to form metallic layers we find values for the equation which compare quite favorably to those needed, i.e. in comparison with the limits of $R_{20}$.

For example, if the unexposed negative material supplied with Polaroid type 51 film is used in conjunction with the processing fluid supplied with Polaroid type 55 film and processed onto a receiving sheet supplied with Polaroid type 51 film, said processing carried out with the negative and receiver spaced approximately twice the normal, i.e. 0.002"-0.003", distance apart, for a period of 180 seconds at 25° C. (77° F.), and then stripped apart. The resulting totally "black" receiver sheet is then cut to 3" by 4". Probes from a Hewlett Packard 4328A Milliohmmeter are placed at the edges of the sample across the width and a reading taken. Typically, the reading taken under the above conditions will indicate a resistance of 3.00 ohms across the sample. By substituting the values present into the equation we derive a value for $R_{25}$ of 0.448305, or roughly 2.7 times that required for equivalency with the half-ounce copper foil rating of 0.16359.

If a sample processed in accordance with the above description is placed in a superposed relation to a new unexposed negative from a Polaroid type 51 film packet, and once again processed using the processing fluid from a Polaroid type 55 film packet, said negative and receiver in this second case separated by means of a mask or boarder approximately twice the thickness of that supplied with Polaroid type 51 film (usually as a paper frame or cut-out semipermanently attached to the receiver supplied with said film packet). Both processing temperature and time in this second case are equal to those given in the first processing step.

The sample processed in accordance with the above second description is now measured in a similar fashion to that first mentioned above. In the case of a receiver upon which two depositions have been made, the reading will usually fall into the range 1.25 to 1.75 ohms, and most usually at the value 1.5 ohms. By substituting this value, i.e. 1.5 ohms, into the equation (along with other required parameters, one obtains a value for $R_{25}$ of 0.224153, or roughly 1.4 times the value specified for copper foil laminates.

If a third deposition is made upon this same receiver, the value for $R_{25}$ closely approximates that required for meeting the IPC specification as herein described. A fourth, fifth, or subsequent deposition will increase the probability that the value for $R_{25}$ will be satisfied.

The multiple deposition techniques of the present invention for producing electrical conductors having varying resistances i.e. "resistors" has many applications. In addition to the previously mentioned printed circuit boards, resistors, capacitors and inductors, other items can be manufactured which utilize the benefits of a photographically produced electrical component or circuit. For example, the DTR embodiment of the process can be employed in conjunction with "instant" photographic identification card systems to produce an ID card which has a unique electrical "signature".

Figure 11:
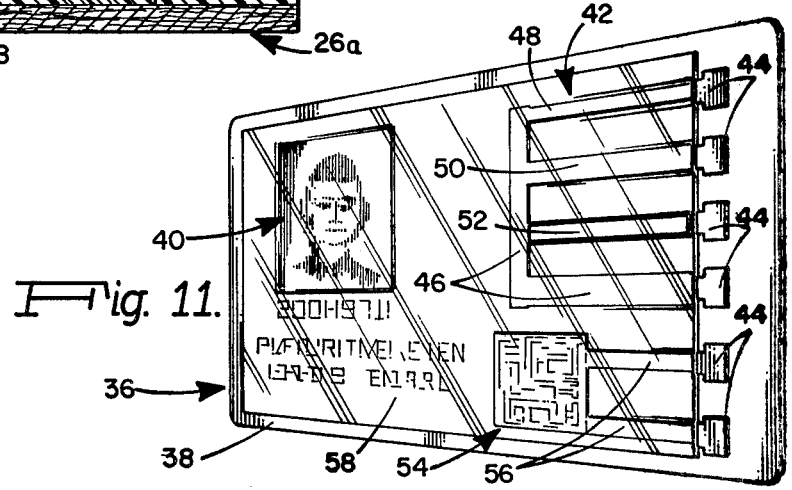
FIG. 11 is a view of an identification card having formed thereon by the process of the invention electrically conductive identification elements.

Looking at FIG. 11 there is shown such a combination ID card indicated generally by the reference numeral 36. The ID card 36 comprises a conventional receiver sheet 38 on which is formed a photographic image or picture 40 by the DTR process. Typically, the photographic image comprises a photograph of the card holder and/or alphanumeric information (hereafter generally called "indicia").

The process of the present invention is used to form one or more electrical components indicated generally by the reference numeral 42. Each electrical component 42 is electrically connected to a terminal pad 44. In the preferred embodiment, the electrical components 42 comprise a common or "ground" strip 46 and a plurality of electrical resistors 48, 50 and 52 each of which has a unique and different electrical resistance. The different electrical resistances can be produced by varying the width of the photographically formed element e.g. a narrow strip 48 and a relatively wider strip 50 and/or by using the multiple deposition technique of the present invention as shown by the multiple layers of element 52.

It will be appreciated that by forming a plurality of electrical resistors 42 with differing resistances, one can produce an electrical "signature" which is unique for the particular identification card. The resistances of the resistors 48, 50 and 52 can be measured by conventional means such as, a VOM (not shown). The electrical contact to the resistors 48, 50 and 52 on the common strip 46 is made through the terminal pads 44.

It is also possible to use the multiple deposition technique of the present invention to produce a complex electrical circuit such as indicated generally by the reference numeral 54 in FIG. 11. The circuit 54 is connected to the terminal pads 44 through corresponding conductors 56 which may be formed by the process of the present invention.

In order to protect the photographic indicia and the photographically produced electrical components 42 and 54 from deleterious environmental effects, a protective layer 58 can be laminated to the front surface of the identification card. Preferably the laminated layer is transparent and terminates just before the terminal pads 44. Alternatively, suitable openings can be formed in the laminate to expose the terminal pads.

Although the preceeding discussion has been directed to the use of resistive electrical "signatures", it will be appreciated that other electrical perimeters can be employed with respect to the photographically formed electrical components. For example, the capacitance between adjacent conductors can be measured by suitable means (not shown).

One of the features of the identification card shown in FIG. 11 is that the photographically formed electrical components 42 are optically distinguishable from the background of the receiver sheet. Accordingly, the optical pattern of the electrical components 42 can be used to produce an optical "signature" or code which can be read by a conventional electro-optical scanner. Thus a double level of coding can be achieved for each ID card.

Having described in detail the preferred embodiment of my invention it will now be apparent to those skilled in the art that numerous modifications can be made then without departing from the scope of the invention as defined in the appended claims.

What I claim and desire to secure by Letters Patent of the United States is:

1. A photographic process comprising the steps of:
    (1) exposing a first photosensitive material comprising a silver halide emulsion layer to form a first latent image segment having at least one unexposed area;
    (2) photographically developing said first latent image segment;
    (3) transferring by diffusion the unexposed silver halide from said unexposed area in the developed first latent image segment as a soluble silver halide complex to a receiving surface to form a first silver image thereon by the precipitation of the transferred silver halide from the soluble silver halide complex;
    (4) exposing a second photosensitive material comprising a silver halide emulsion layer to form a second latent image segment having at least one unexposed area;
    (5) photographically developing said second latent image segment; and,
    (6) transferring by diffusion the unexposed silver halide from said unexposed area in the developed second latent image segment as a soluble silver halide complex to said receiving surface to form a second silver image thereon with at least a portion of said second silver image being formed in superposed relation to said first silver image, said second silver image being formed by the precipitation of the transferred silver halide from the soluble silver halide complex and with the diffusion transfer of Step (6) occurring after the diffusion transfer of Step (3).

2. The process of claim 1 wherein said first and second latent image segment unexposed areas are formed with at least a portion that is common to each image segment.

3. The process of claim 2, wherein the unexposed silver halide from each of the common portions of said first and second developed latent image segments is transferred to said receiving surface and forms through precipitation thereon corresponding portions of said first and second silver images in superposed relation.

4. The process of claim 3 wherein the transferred, unexposed silver halide from said developed first latent image segment is rendered electrically conductive.

5. The process of claim 4, wherein the corresponding portions of said first and second silver images are in electrically conductive contact with each other.

6. The process of claim 3, further comprising the step of covering at least part of said first silver image portion with an electrically insulating material before forming said second silver image corresponding portion in superposed relation.

7. The process of claim 6 further comprising the step of rendering electrically conductive the transferred, unexposed silver halide from said developed second latent image segment.

8. The process of claim 3 further comprising the steps of:
(1) performing the following steps "n" times where "n" is a positive whole number including 1:
  (a) exposing another photosensitive material comprising a silver halide emulsion layer to form another latent image segment having at least one unexposed area;
  (b) photographically developing said another latent image segment;
  (c) transferring by diffusion the unexposed silver halide from said unexposed area in the developed another latent image segment as a soluble silver halide complex to said receiving surface to form another silver image thereon with at least a portion of said another silver image being formed in superposed relation to said second silver image, said another silver image being formed by the precipitation of the transferred silver halide from the soluble silver halide complex before transferring the unexposed silver halide from the developed second latent image segment;
    (a) rendering electrically conductive the transferred, unexposed silver halide from each developed another latent image segment; and,
(2) interposing a layer of electrically insulating material between at least a portion of the last formed another silver image and the second silver image.

9. The process of claim 1 further comprising the step of rendering electrically conductive the transferred, unexposed silver halide from said developed first latent image segment.

10. The process of claim 1 further comprising the step of rendering electrically conductive the transferred, unexposed silver halide from said developed second latent image segment.

11. The process of claim 1 further comprising the step of covering at least part of said first silver image portion with an electrically insulating material before forming said second silver image corresponding portion in superposed relation.

12. The process of claim 11 further comprising the step of rendering electrically conductive the transferred, unexposed silver halide from said developed second latent image segment.

13. The process of claim 12 further comprising the step of rendering electrically conductive the transferred, unexposed silver halide from said developed first latent image segment.

14. The process of claim 13 wherein said transferred, unexposed silver halide from said developed first latent image segment is rendered electrically conductive on said receiving surface before covering at least a portion thereof with said insulating material.

15. A photographic process comprising the steps of:
(1) exposing a first photosensitive material comprising a silver halide emulsion layer to form a first latent image segment having at least one unexposed area;
(2) photographically developing said first latent image segment;
(3) transferring by diffusion the unexposed silver halide from said unexposed area in the developed first latent image as a soluble silver halide complex to a receiving surface to form a first silver image thereon by the precipitation of the transferred silver halide from the soluble silver halide complex;
(4) performing the following steps "n" times, where "n" is a positive whole number including 1:
  (a) exposing another photosensitive material comprising a silver halide emulsion layer to form another latent image segment having at least one unexposed area;
  (b) photographically developing said another latent image segment;
  (c) transferring by diffusion the unexposed silver halide from said unexposed area in the developed another latent image segment as a soluble silver halide complex to said receiving surface to form another silver image thereon with at least a portion of said another silver image being formed in superposed relation to said first silver image, said another silver image being formed by the precipitation of the transferred silver halide from the soluble silver halide complex and with the diffusion transfer of Step 4(c) occuring after the diffusion transfer of Step 3; and,
(5) covering the last formed another silver image from the transferred unexposed silver halide from the developed another latent image segment with a layer of an electrically insulating material.

16. The process of claim 15 further comprising the steps of rendering electrically conductive the transferred, unexposed silver halide from said developed first and second latent image segments.

17. The process of claim 15 wherein the portions of said first and second silver images and said another silver image that are formed on said receiving surface in superposed relation are in electrically conductive contact with each other.

18. The process of claim 17 further comprising repeating steps 1 through 4 thereof "n" times where "n" is a positive whole number including one.

19. A photographic process comprising the steps of:
(1) exposing a first photosensitive material comprising a silver halide emulsion layer to form a first latent image segment having at least one unexposed area;

(2) transferring by a diffusion transfer development process the unexposed silver halide from said first latent image segment unexposed area as a soluble silver halide complex to a diffusion transfer receiving surface to form a first silver image thereon by the precipitation of the transferred silver halide from the soluble silver halide complex, said transferred, unexposed silver halide being rendered electrically conductive by the diffusion transfer development process;

(3) exposing a second photosensitive material comprising a silver halide emulsion layer to form a second latent image segment having at least one unexposed area; and, (4) transferring by a diffusion transfer development process the unexposed silver halide from said second latent image segment unexposed area as a soluble silver halide complex to said receiving surface to form a second silver image thereon with at least a portion of said second silver image being formed in superposed relation to said first silver image, said second silver image being formed by the precipitation of the transferred silver halide from the soluble silver halide complex, and said transferred, unexposed silver halide being rendered electrically conductive by the diffusion transfer development process, with the diffusion transfer of Step (4) occurring after the diffusion transfer of Step (2).

20. The process of claim 19 wherein said first and second latent image segment unexposed areas are formed with at least a portion that is common to each image segment and wherein the unexposed silver halide from each of the common portions of said first and second latent image segments is transferred to said receiving surface and precipitated thereon to form the portions of said first and second silver images that are in superposed relation.

21. The process of claim 20 wherein the portions of the first and second silver images formed for the common portions of the unexposed silver halide are in electrically conductive contact with each other and have a lower electrical registivity than the other portions of the two silver images.

22. The process of claim 19 further comprising the step of covering at least a portion of the silver image formed from the precipitation of the transferred, unexposed silver halide from the first latent image segment with an electrically insulating material before forming the second silver image on the receiving surface.

23. The process of claim 19 further comprising the steps of:
(1) exposing another photosensitive material comprising a silver halide emulsion layer to form another latent image segment having at least one unexposed area; and,
(2) transferring by a diffusion transfer development process the unexposed silver halide from said another latent image segment unexposed area as a soluble silver halide complex to said receiving surface to form another silver image thereon with at least a portion of said another silver image being formed in superposed relation to said first silver image, said another silver image being formed by the precipitation of the transferred silver halide from the soluble silver complex, and said transferred, unexposed silver halide being rendered electrically conductive by the development diffusion transfer process, with the diffusion transfer of the silver halide from said another latent image segment unexposed area occurring after the diffusion transfer of Step (4) in claim 22.

24. The process of claim 23 wherein said first and second latent image segment unexposed areas and said another latent image segment unexposed area are each formed with at least a portion that is common to each image segment an wherein the unexposed silver halide from each of the common portions of said latent image segments is transferred to said receiving surface and precipitated thereon to form the portions of said first, second and another silver images that are in superposed relation and in electrically conductive contact with each other.

25. The process of claim 23 further comprising repeating steps 1 and 2 thereof "n" times where "n" is a positive whole number.

26. The process of claim 19 wherein each photosensitive material having a latent image segment formed thereon is positioned a predetermined but different distance from the receiving surface, said predetermined distance for each photosensitive material being a function of the accumulated thickness of the previously transferred unexposed silver halide from the photosensitive materials.

27. A photographic process comprising the steps of:
(1) exposing a first photosensitive material comprising a silver halide emulsion layer to form a first latent image segment having at least one unexposed area;
(2) photographically developing said first latent image segment;
(3) transferring by diffusion the unexposed silver halide from said unexposed area in the developed first latent image segment as a soluble silver halide complex to a receiving surface to form a first silver image thereon by the precipitation of the transferred silver halide from the soluble silver halide complex; and thereafter,
(4) performing the following steps "n" times, where "n" is a positive whole number including 1:
  (a) exposing another photosensitive material comprising a silver halide emulsion layer to form another latent image segment having at least one unexposed area;
  (b) photographically developing said another latent image segment;
  (c) transferring by diffusion the unexposed silver halide from said unexposed area in the developed another latent image segment as a soluble silver halide complex to said receiving surface to form another silver image thereon with at least a portion of said another silver image being formed in superposed relation to said first silver image, said another silver image being formed by the precipitation of the transferred silver halide from the soluble silver halide complex.

* * * * *

UNITED STATES PATENT AND TRADEMARK OFFICE
CERTIFICATE OF CORRECTION

PATENT NO. : 4,192,640
DATED : March 11, 1980
INVENTOR(S) : Glenn W. Merry

It is certified that error appears in the above-identified patent and that said Letters Patent are hereby corrected as shown below:

Column 1, line 13, delete "processes", and insert therefor
--process--.

Column 2, line 2, delete "te", and insert therefor --the--;
line 8, delete "and.".

Signed and Sealed this

Fourth Day of October 1983

[SEAL]

Attest:

Attesting Officer

GERALD J. MOSSINGHOFF

Commissioner of Patents and Trademarks